(12) United States Patent
Jang

(10) Patent No.: US 8,969,959 B2
(45) Date of Patent: Mar. 3, 2015

(54) SEMICONDUCTOR DEVICE AND METHOD OF MANUFACTURING THE SAME

(71) Applicant: Samsung Electro-Mechanics Co., Ltd., Suwon (KR)

(72) Inventor: Chang Su Jang, Suwon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 13/795,414

(22) Filed: Mar. 12, 2013

(65) Prior Publication Data

US 2014/0175612 A1 Jun. 26, 2014

(30) Foreign Application Priority Data

Dec. 20, 2012 (KR) .......................... 10-2012-0149347

(51) Int. Cl.
*H01L 27/088* (2006.01)
*H01L 29/06* (2006.01)

(52) U.S. Cl.
CPC .................................. *H01L 29/0603* (2013.01)
USPC .... 257/341; 257/401; 257/491; 257/E27.018; 257/E29.013; 438/140; 438/268; 438/272

(58) Field of Classification Search
USPC .......... 257/491, 501, 502, E27.018, E29.013, 257/E21.544, E21.602, 341, 618; 438/140, 438/268, 272, 478
See application file for complete search history.

(56) References Cited

U.S. PATENT DOCUMENTS 6,465,863 B1 10/2002 Deboy et al.
6,936,893 B2 * 8/2005 Tanaka et al. ................. 257/341

FOREIGN PATENT DOCUMENTS

| JP | 2008-10506 | 1/2008 |
| JP | 2012-216705 | 11/2012 |
| KR | 10-135489 | 5/1998 |

OTHER PUBLICATIONS

Korean Office Action issued on May 16, 2014 in corresponding Korean Patent Application No. 10-2012-0149347.

* cited by examiner

*Primary Examiner* — Jasmine Clark

(57) ABSTRACT

There are provided a semiconductor device and a method of manufacturing the same. The semiconductor device includes a body layer of a first conductivity type; an active layer of a second conductivity type, contacting an upper portion of the body layer; and a field limiting ring of a first conductivity type, formed in an upper portion of the active layer.

17 Claims, 4 Drawing Sheets

SEMICONDUCTOR DEVICE AND METHOD OF MANUFACTURING THE SAME

CROSS-REFERENCE TO RELATED APPLICATIONS

This application claims the priority of Korean Patent Application No. 10-2012-0149347 filed on Dec. 20, 2012, in the Korean Intellectual Property Office, the disclosure of which is incorporated herein by reference.

BACKGROUND OF THE INVENTION

1. Field of the Invention

The present invention relates to a semiconductor device and a method of manufacturing the same.

2. Description of the Related Art

Recent high-speed switching diodes require fast switching characteristics and soft recovery characteristics.

Since a common PN-junction diode in the field of diodes uses minority carriers, a forward voltage may be lowered due to a conductivity modulation effect.

However, high-speed switching characteristics are deteriorated due to reverse recovery caused by the minority carriers.

When a reverse voltage is rapidly applied to a PN junction diode while a forward current is flowing therein, a high-level reverse current flows instantly, since minority carriers injected from a PN junction move in reverse, and reverse recovery characteristics refer to a current flowing until the minority carriers flow out or are extinct.

A high-speed switching diode may shorten the time taken for the reverse current to reach 0 (time of reverse recovery: trr) and have soft recovery characteristics by smoothening a reverse current waveform.

High-speed switching diodes are largely classified into a fast recovery diode (FRD), a high-efficiency diode (HED), and a schottky barrier diode (SBD).

A FRD has the same structure as a general PN diode, but is a diode in which minority carriers are quickly extinct after turn-off by diffusing impurities such as platinum, gold, and the like in silicon through electrons or neutron beam irradiation to increase recombination of electrons and holes.

In the related art, a P− type active layer of the FRD is formed by injecting and diffusing P type impurities.

In addition, a separate space is needed to apply a field limiting ring for maintaining the withstand voltage of a device.

A device requiring a high withstand voltage requires more space, leading to an increase in chip size.

In particular, in the case that the space for applying the field limiting ring thereto is wider, an active area of the device may be narrower.

Since the active area in which devices operate may be further reduced due to miniaturization and higher degrees of integration of existing types of electronic equipment or electronic devices, it is necessary to maintain the withstand voltage and secure the active area.

Patent Document 1 of Related Art Document below discloses an invention relating to a PIN diode.

Patent Document 1 discloses a semiconductor device including a predetermined film having crystal defects formed in an anode or a cathode.

However, the invention described in Patent Document 1 has a disadvantage in that since the predetermined film is in contact with the anode or the cathode, the withstand voltage is not maintained in the contact area.

Therefore, the invention disclosed in Patent Document 1 fails to prevent forward voltage drop, and is different from the present invention in view of the constitution and effects thereof.

Patent Document 1 is directed to a power semiconductor device.

However, it fails to disclose a field limiting ring formed inside a P type semiconductor area.

RELATED ART DOCUMENT (Patent Document 1) Japanese Patent Laid-Open Publication No. 1998-135489

SUMMARY OF THE INVENTION

An aspect of the present invention provides a semiconductor device capable of maintaining a withstand voltage and having a large active area, and a method of manufacturing the same.

According to an aspect of the present invention, there is provided a semiconductor device, including: a body layer of a first conductivity type; an active layer of a second conductivity type, contacting an upper portion of the body layer; and a field limiting ring of a first conductivity type, formed in an upper portion of the active layer.

The active layer may enlarge an area through which current flows during an ON operation of the semiconductor device.

Here, a contact portion of the active layer and the body layer may have a wave shape or a concavo-convex shape.

The semiconductor device may further include an anode layer of a high-concentration second conductivity type, formed in the upper portion of the active layer.

The semiconductor device may further include an anode metal layer formed on an upper portion of the anode layer and electrically connected to the anode layer.

The semiconductor device may further include a cathode layer of a high-concentration first conductivity type, contacting a lower portion of the body layer.

The semiconductor device may further include a cathode metal layer formed on a lower portion of the cathode layer and electrically connected to the cathode layer.

The semiconductor device may further include a field stop layer of a high-concentration first conductivity type, formed in the active layer and having the same depth as that of the active layer.

According to another aspect of the present invention, there is provided a method of manufacturing a semiconductor device, the method including: preparing a body layer of a first conductivity type; forming an active layer of a second conductivity type on an upper portion of the body layer; and forming a field limiting ring of a first conductivity type in an upper portion of the active layer.

The forming of the active layer may be performed by an epitaxial method.

The forming of the active layer may include: injecting a second conductivity type impurity into the body layer; and heat-treating the body layer in which the second conductivity type impurity has been injected.

Here, a contact portion of the active layer and the body layer may have a wave shape or a concavo-convex shape.

The method may further include forming an anode layer of a second conductivity type in the upper portion of the active layer.

The method may further include an anode metal layer on an upper portion of the anode layer, the anode metal layer being electrically connected to the anode layer.

The method may further include forming a cathode layer of a high-concentration first conductivity type on a lower portion of the body layer.

The method may further include forming a cathode metal layer on a lower portion of the cathode layer, the cathode metal layer being electrically connected to the cathode layer.

The method may further include forming a field stop layer of a high-concentration first conductivity type in the active layer, the field stop layer having the same depth as that of the active layer.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
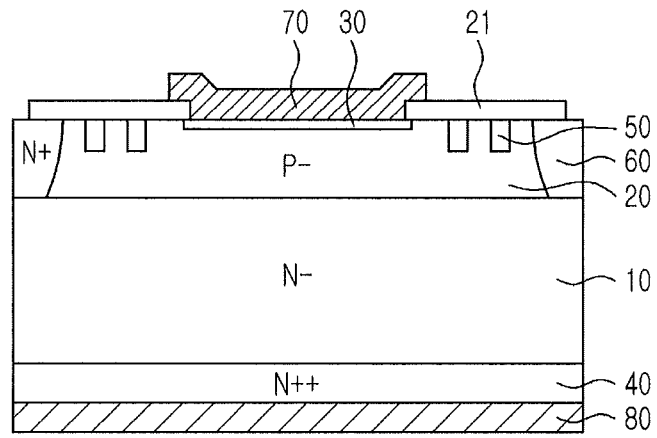
FIG. 1 is a schematic cross-sectional view of a semiconductor device according to an embodiment of the present invention.

Hereinafter, embodiments of the present invention will be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

A power switch may be embodied by any one of a power MOSFET, an IGBT, several types of thyristor, or the like. New technologies disclosed herein will be described based on a fast recovery diode (FRD). However, embodiments of the invention disclosed herein are not limited to those based on an FRD. For example, besides the diode, other types of power switches, including a power MOSFET and several types of thyristors, may also be employed. Further, the embodiments of the invention are described to include specific P type and N type areas. However, conductivity types of several areas disclosed herein may be applied to devices having areas of counter conductivity types in the same manner.

Also, the terms "N type" and "P type" used herein may refer to a first conductivity type or a second conductivity type. Meanwhile, the first conductivity type and the second conductivity type may be different conductivity types.

In addition, generally, the symbol '+' refers to a highly doped state, and the symbol '−' refers to a lowly doped state.

FIG. 1 is a cross-sectional view schematically showing a semiconductor device according to an embodiment of the present invention.

Referring to FIG. 1, a semiconductor device according to an embodiment of the invention may include: a body layer 10 of a first conductivity type; an active layer 20 of a second conductivity type, contacting an upper portion of the body layer 10; and a field limiting ring 50 of a first conductivity type, formed in an upper portion of the active layer 20.

The semiconductor device according to the embodiment of the invention may include the field limiting ring 50 of a high-concentration N+ type, positioned in an active layer 20 of a low-concentration P− type.

The field limiting ring 50 functions to prevent the loss of voltage at the time of applying a forward bias by reducing a concentration of an electrical field on an edge portion of a depletion layer in a high-withstand voltage device.

In a general case, since the field limiting ring 50 is formed outside of the active layer 20 and inside of the body layer 10, the active layer 20 is unavoidably narrowed in order to form the field limiting ring 50.

Therefore, during an ON operation of the semiconductor device, an area through which current substantially flows may be reduced and efficiency of current to area of device may be degraded.

However, in the case of the semiconductor device according to the embodiment of the invention, the field limiting ring 50 is formed inside the active layer 20, so that the area through which current substantially flows during an ON operation of the semiconductor device is increased.

Therefore, the efficiency of current based on the area of the semiconductor device can be improved.

The semiconductor device according the embodiment of the invention may further include an anode layer 30 of a high-concentration second conductivity type, formed in the upper portion of the active layer 20.

In addition, the semiconductor device according to the embodiment of the invention may further include an anode metal layer 70 formed on an upper portion of the anode layer 30 and electrically connected to the anode layer 30.

The semiconductor device according the embodiment of the invention may further include a cathode layer 40 of a high-concentration first conductivity type, contacting a lower portion of the body layer 10.

In addition, the semiconductor device according to the embodiment of the invention may further include a cathode metal layer 80 formed on the lower portion of the cathode layer 40 and electrically connected to the cathode layer 40.

The semiconductor device according the embodiment of the invention may further include a field stop layer 60 of a high-concentration first conductivity type, formed in the active layer 20 and having the same depth as that of the active layer 20.

The depth of the field stop layer 60 may be equal to or greater than that of the active layer 20.

The field stop layer 60 may serve to prevent generation of a leakage current due to extension of the depletion layer to a section of the semiconductor device.

Therefore, in the case in which the depth of the field stop layer 60 is smaller than that of the active layer 20, the depletion layer may be in contact with the section of the semiconductor device across the field stop layer 60, which may cause the leakage current.

Figure 2:
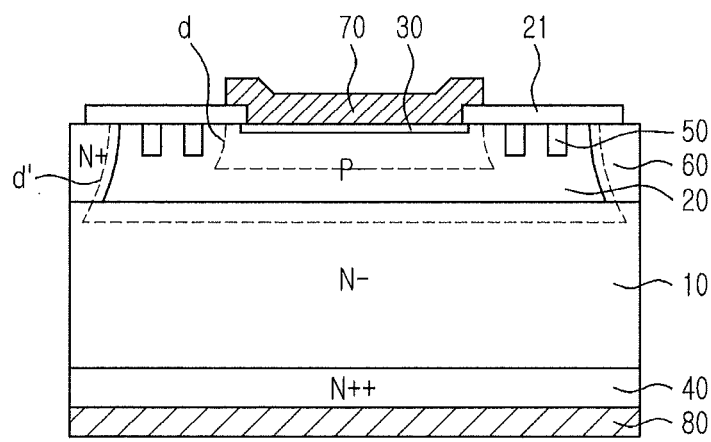
FIG. 2 is a schematic cross-sectional view showing a change of a depletion layer at the time of on-off operation of the semiconductor device according to the embodiment of the present invention.

FIG. 2 is a schematic cross-sectional view showing a change of a depletion layer during ON and OFF operations of the semiconductor device according to the embodiment of the present invention.

Generally, a PN junction diode is formed by joining a P type semiconductor and an N type semiconductor with each other.

When the P type semiconductor and the N type semiconductor are joined to each other, P type holes and N type electrons are combined with each other in a junction area to form a depletion layer.

The depletion layer forms an insulation area having no carriers such as holes or electrons, and interrupts movement of the carriers that pass through the junction area.

In order to allow the carriers such as holes or electrons to pass through the depletion layer, voltage having a predetermined level or higher is required, and this voltage is called a potential barrier.

The forward bias refers to an application of voltage when a positive electrode is connected to the P type anode layer 30 and a negative electrode is connected to the N type cathode layer 40.

When the forward bias is applied, holes present in the P type anode layer 30 move toward the N type cathode layer 40 due to the effect of an electrical field, and electrons present in the N type cathode layer 40 move toward the P type anode layer 30 due to the effect of an electrical field.

Therefore, the depletion layer formed by joining the P type semiconductor and the N type semiconductor may be reduced (dotted line d in FIG. 2).

Consequently, the movement of the holes and the electrons is smooth, whereby current flows during the ON operation of the semiconductor device.

When a reverse bias contrary to the forward bias is applied, the holes present in the P type anode layer 30 are further driven toward the P type anode layer 30 due to the effect of an electrical field, and the electrons present in the N type cathode layer 40 are further driven toward the N type anode layer 40 due to the effect of an electrical field.

Therefore, the depletion layer formed by joining the P type semiconductor and the N type semiconductor may be enlarged (dotted line d' in FIG. 2).

Consequently, the movement of the holes and the electrons is not smooth, whereby current does not flow during the OFF operation of the semiconductor device.

Figure 3:
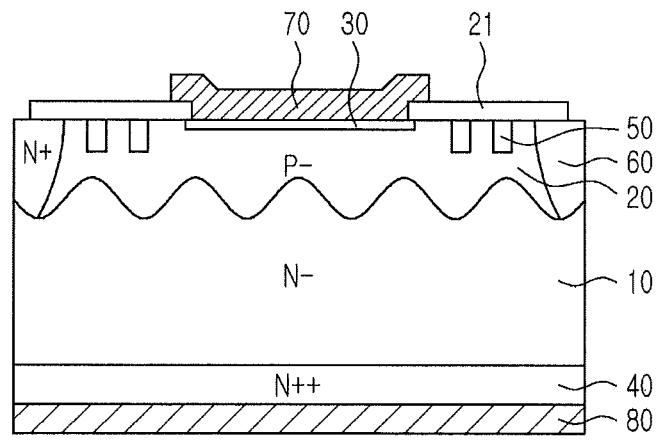
FIG. 3 is a schematic cross-sectional view of a semiconductor device according to another embodiment of the present invention.

FIG. 3 is a cross-sectional view schematically showing a semiconductor device according to another embodiment of the present invention.

A semiconductor device according to another embodiment of the invention may include: a body layer 10 of a first conductivity type; an active layer 20 of a second conductivity type, contacting an upper portion of the body layer 10; and a field limiting ring 50 of a first conductivity type, formed in an upper portion of the active layer 20, and a contact portion between the active layer 20 and the body layer 10 may have a wave shape or a concavo-convexshape.

Since the contact portion between the active layer 20 and the body layer 10 has a wave shape or a concavo-convexshape, the contact area between the active layer 20 and the body layer 10 may be increased.

Therefore, a path of current passing through a contact surface of the active layer 20 and the body layer 10 may be increased during an ON operation of the semiconductor device.

FIGS. 4A through 4G are schematic views showing a process for manufacturing a semiconductor device according to an embodiment of the present invention.

Figure 4A:
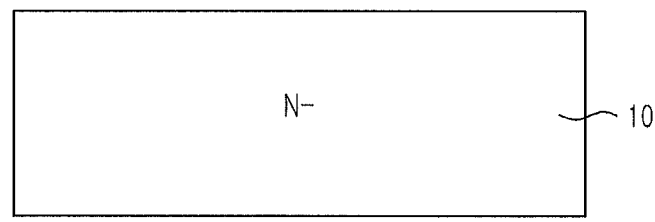
FIGS. 4A through 4G are cross-sectional views showing a process for manufacturing a semiconductor device according to an embodiment of the present invention.
Figure 4B:
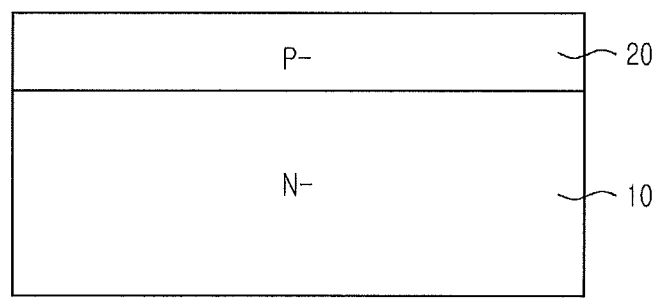
Figure 4C:
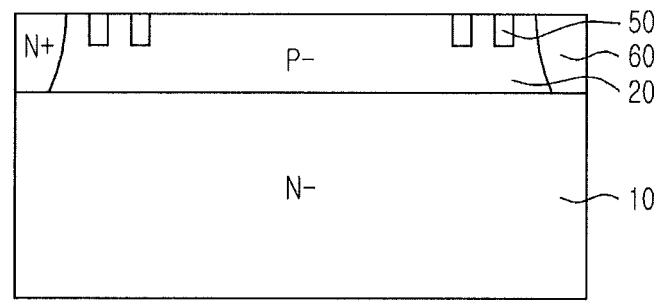

A method of manufacturing a semiconductor device according to the embodiment of the invention, the method including: preparing a body layer 10 of a first conductivity type (FIG. 4A); forming an active layer 20 of a second conductivity type on an upper portion of the body layer 10 (FIG. 4B); and forming a field limiting ring 50 of a first conductivity type in an upper portion of the active layer 20 (FIG. 4C).

The forming of the active layer 20 (FIG. 4B) may be performed by an epitaxial method.

The active layer 20 is formed by the epitaxial method, and thus the active layer 20 may have a sufficiently large area and be relatively thick.

In addition, the forming of the active layer 20 (FIG. 4B) may include: injecting a second conductivity type impurity into the body layer 10; and heat-treating the body layer in which the second conductivity type impurity has been injected.

The active layer 20 may have a natural concentration gradient by injecting the second conductivity type impurity into the body layer 10, followed by heat treatment.

The forming of the field limiting ring 50 (FIG. 4C) may include forming a field stop layer 60 of a high-concentration first conductivity type in the active layer 20, the field stop layer 60 having the same depth as that of the active layer 20.

The field limiting ring 50 and the field stop layer 60 may be formed by injection of an N type impurity, but is not limited thereto.

The field stop layer 60 may have a depth equal to or greater than that of the active layer 20.

In the manufacturing method according to the embodiment of the invention, a contact portion of the active layer 20 and the body layer 10 may have a wave shape or a concavo-convex shape.

In order to allow the contact portion of the active layer 20 and the body layer 10 to have the wave shape or the concavo-convex shape, the preparing of the body layer 10 (FIG. 4A) may include etching an upper portion of the body layer 10.

Figure 4D:
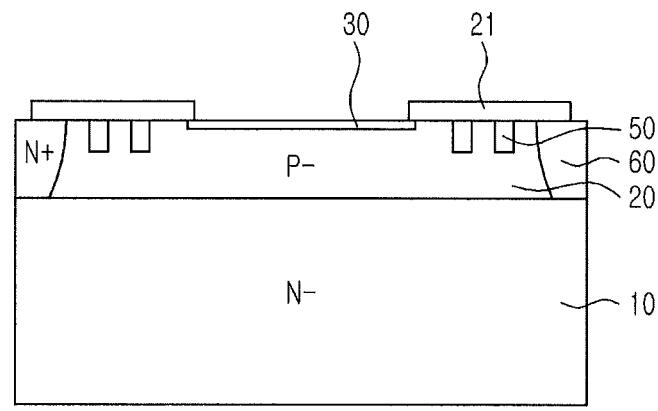

The manufacturing method according to the embodiment of the invention may further include forming an anode layer 30 of a second conductivity type in the upper portion of the active layer 20 (FIG. 4D).

The anode layer 30 may be formed by forming an insulating layer 21 in an upper portion of the semiconductor device and then injecting a P type impurity thereinto at a high concentration.

Figure 4E:
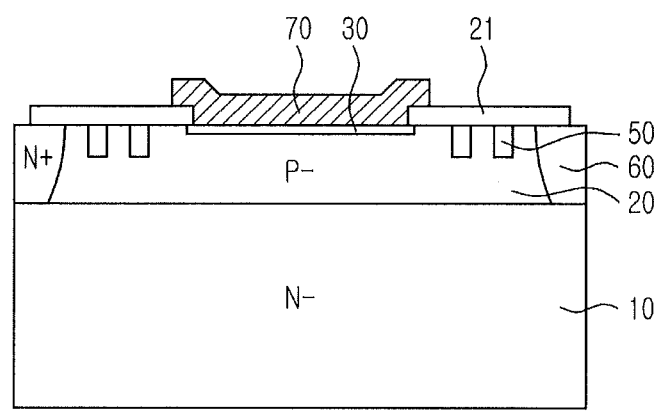

The manufacturing method according to the embodiment of the invention may further include forming an anode metal layer 70 on the anode layer 30, the anode metal layer 70 being electrically connected to the anode layer 30 (FIG. 4E).

Figure 4F:
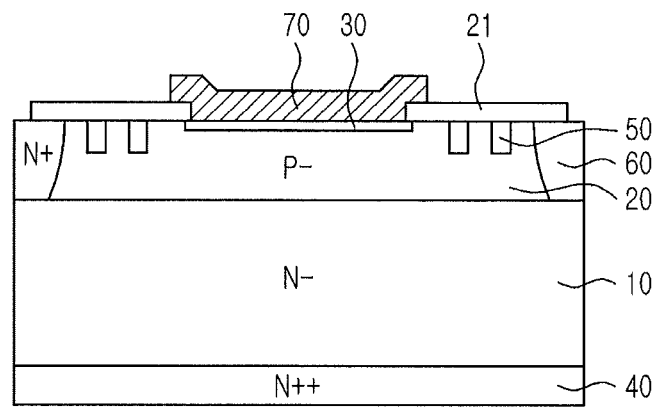

The manufacturing method according to the embodiment of the invention may further include forming a cathode layer 40 of a high-concentration first conductivity type on a lower portion of the body layer 10 (FIG. 4F).

Before forming the cathode layer 40, a rear surface of the semiconductor device may be ground.

Since the rear surface of the semiconductor device is ground, the thickness of the semiconductor device may be appropriately adjusted.

Figure 4G:
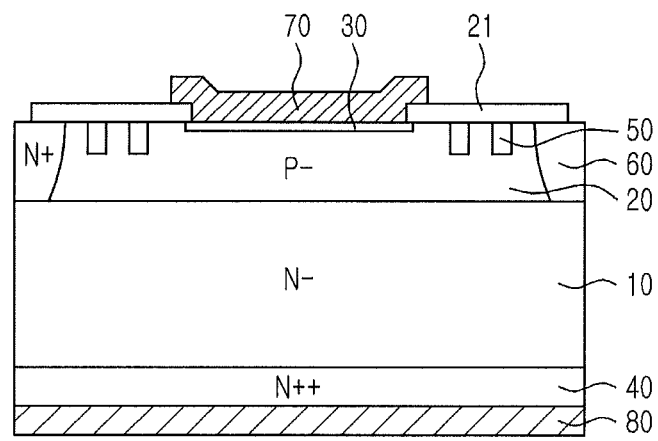

The manufacturing method according to the embodiment of the invention may further include forming a cathode metal layer 80 on the lower portion of the cathode layer 40, the cathode metal layer 80 being electrically connected to the cathode layer 40 (FIG. 4G).

As set forth above, according to embodiments of the present invention, the technical disadvantages of the above-described related art are solved by the disclosure of the present specification.

Specifically, in a semiconductor device according to the embodiments of the present invention, an area through which current can flow may be increased at the time of an ON operation of the semiconductor device, by forming a field limiting ring in an upper portion of an active layer.

Therefore, due to the field limiting ring, the semiconductor device has maintained withstand voltage and a large active area.

While the present invention has been shown and described in connection with the embodiments, it will be apparent to those skilled in the art that modifications and variations can be made without departing from the spirit and scope of the invention as defined by the appended claims.

What is claimed is:

1. A semiconductor device, comprising:
a body layer of a first conductivity type;
an active layer of a second conductivity type, contacting an upper portion of the body layer;
a field limiting ring of a first conductivity type, formed in an upper portion of the active layer; and
an anode layer of a high-concentration second conductivity type, formed in the upper portion of the active layer.

2. The semiconductor device of claim 1, wherein the active layer enlarges an area through which current flows during an ON operation of the semiconductor device.

3. The semiconductor device of claim 1, wherein a contact portion of the active layer and the body layer has a wave shape or a concavo-convex shape.

4. The semiconductor device of claim 1, further comprising an anode metal layer formed on an upper portion of the anode layer and electrically connected to the anode layer.

5. The semiconductor device of claim 1, further comprising a cathode layer of a high-concentration first conductivity type, contacting a lower portion of the body layer.

6. The semiconductor device of claim 5, further comprising a cathode metal layer formed on a lower portion of the cathode layer and electrically connected to the cathode layer.

7. The semiconductor device of claim 1, further comprising a field stop layer of a high-concentration first conductivity type, formed in the active layer and having the same depth as that of the active layer.

8. A method of manufacturing a semiconductor device, the method comprising:
preparing a body layer of a first conductivity type;
forming an active layer of a second conductivity type on an upper portion of the body layer;
forming a field limiting ring of a first conductivity type in an upper portion of the active layer; and
forming an anode layer of a second conductivity type in the upper portion of the active layer.

9. The method of claim 8, wherein the forming of the active layer is performed by an epitaxial method.

10. The method of claim 8, wherein the forming of the active layer comprises:
injecting a second conductivity type impurity into the body layer; and
heat-treating the body layer in which the second conductivity type impurity has been injected.

11. The method of claim 8, wherein a contact portion of the active layer and the body layer has a wave shape or a concavo-convex shape.

12. The method of claim 8, further comprising forming an anode metal layer on an upper portion of the anode layer, the anode metal layer being electrically connected to the anode layer.

13. The method of claim 8, further comprising forming a cathode layer of a high-concentration first conductivity type on a lower portion of the body layer.

14. The method of claim 13, further comprising forming a cathode metal layer on a lower portion of the cathode layer, the cathode metal layer being electrically connected to the cathode layer.

15. The method of claim 8, further comprising forming a field stop layer of a high-concentration first conductivity type in the active layer, the field stop layer having the same depth as that of the active layer.

16. A semiconductor device, comprising:
a body layer of a first conductivity type;
an active layer of a second conductivity type, contacting an upper portion of the body layer;
a field limiting ring of a first conductivity type, formed in an upper portion of the active layer; and
a cathode layer of a high-concentration first conductivity type, contacting a lower portion of the body layer.

17. The semiconductor device of claim 16, further comprising a cathode metal layer formed on a lower portion of the cathode layer and electrically connected to the cathode layer.

* * * * *